United States Patent
Yasui et al.

(10) Patent No.: US 12,063,744 B2
(45) Date of Patent: Aug. 13, 2024

(54) MOVING WORK MANAGEMENT DEVICE, MOVING WORK DEVICE, MOUNTING SYSTEM, AND MANAGEMENT METHOD

(71) Applicant: FUJI CORPORATION, Chiryu (JP)

(72) Inventors: Yoshihiro Yasui, Nagoya (JP); Yukihiro Yamashita, Toyohashi (JP)

(73) Assignee: FUJI CORPORATION, Chiryu (JP)

( * ) Notice: Subject to any disclaimer, the term of this patent is extended or adjusted under 35 U.S.C. 154(b) by 765 days.

(21) Appl. No.: 17/265,444

(22) PCT Filed: Aug. 23, 2018

(86) PCT No.: PCT/JP2018/031147
§ 371 (c)(1),
(2) Date: Feb. 2, 2021

(87) PCT Pub. No.: WO2020/039545
PCT Pub. Date: Feb. 27, 2020

(65) Prior Publication Data
US 2021/0235605 A1     Jul. 29, 2021

(51) Int. Cl.
*B23P 19/00*        (2006.01)
*G05B 19/4155*    (2006.01)
(Continued)

(52) U.S. Cl.
CPC ......... *H05K 13/02* (2013.01); *G05B 19/4155* (2013.01); *G06Q 10/06313* (2013.01); *G06Q 50/04* (2013.01); *G05B 2219/50391* (2013.01)

(58) Field of Classification Search
CPC ............. G06Q 50/04; G06Q 10/06313; G05B 19/4155; G05B 2219/50391; H05K 13/021; H05K 13/0417; H05K 13/0857
See application file for complete search history.

(56) References Cited

U.S. PATENT DOCUMENTS

| 10,925,200 | B2 * | 2/2021 | Iisaka | H05K 13/0452 |
| 11,445,649 | B2 * | 9/2022 | Sanji | H05K 13/0452 |
| 11,582,891 | B2 * | 2/2023 | Kawai | H05K 13/021 |

FOREIGN PATENT DOCUMENTS

| EP | 3 174 376 A1 | 5/2017 |
| EP | 3 344 027 A1 | 7/2018 |

(Continued)

OTHER PUBLICATIONS

International Search Report issued on Oct. 30, 2018 in PCT/JP2018/031147 filed on Aug. 23, 2018, 2 pages.

*Primary Examiner* — Paul D Kim
(74) *Attorney, Agent, or Firm* — Oblon, McClelland, Maier & Neustadt, L.L.P.

(57) ABSTRACT

The mounting system includes a mounting device including a mounting section, a supply section, and a mounting control section, and a moving work management device. The moving work management device creates loading order information including the loading order of the feeders to be loaded to the loading section with preference given to the feeders to be used in the current production over the feeders to be used in the next production onward based on multiple pieces of feeder arrangement information and the order of use of the multiple feeders, the multiple pieces of feeder arrangement information handling each of multiple pieces of mounting condition information for producing multiple types of mounting targets including the arrangement positions of the feeders created corresponding to positions shared among the productions of multiple types of mounting targets.

7 Claims, 6 Drawing Sheets

(51) Int. Cl.
*G06Q 10/0631* (2023.01)
*G06Q 50/04* (2012.01)
*H05K 13/02* (2006.01)

(56) References Cited

FOREIGN PATENT DOCUMENTS

| JP | 2003-229697 A | 8/2003 |
| WO | 2014/068712 A1 | 5/2014 |
| WO | 2017/033268 A1 | 3/2017 |

\* cited by examiner

Fig.5
Fig. 5A
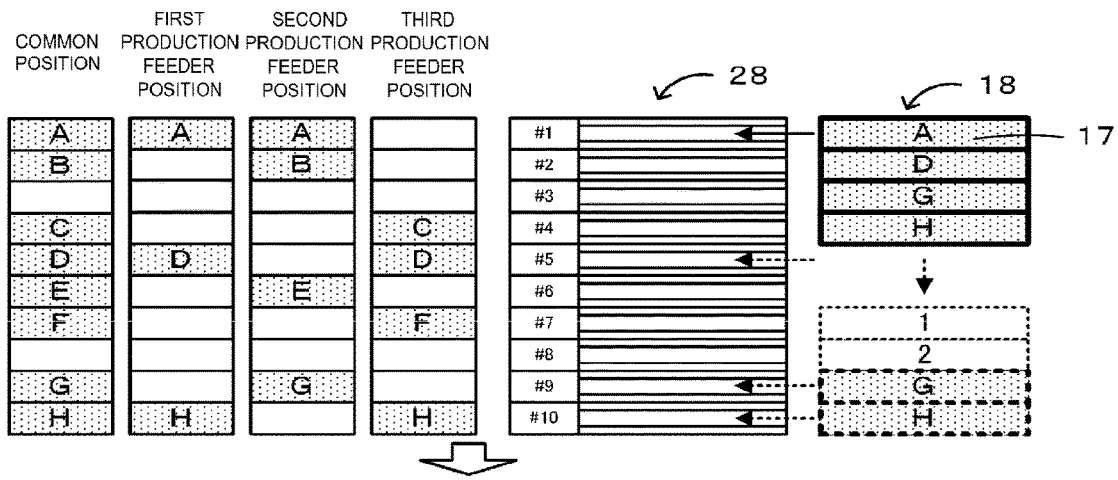
Fig. 5B
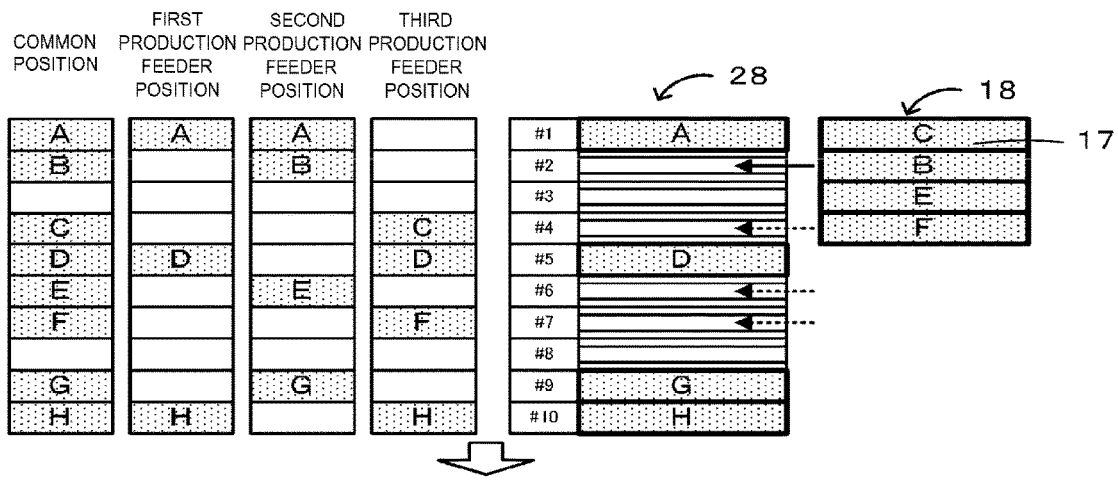
Fig. 5C
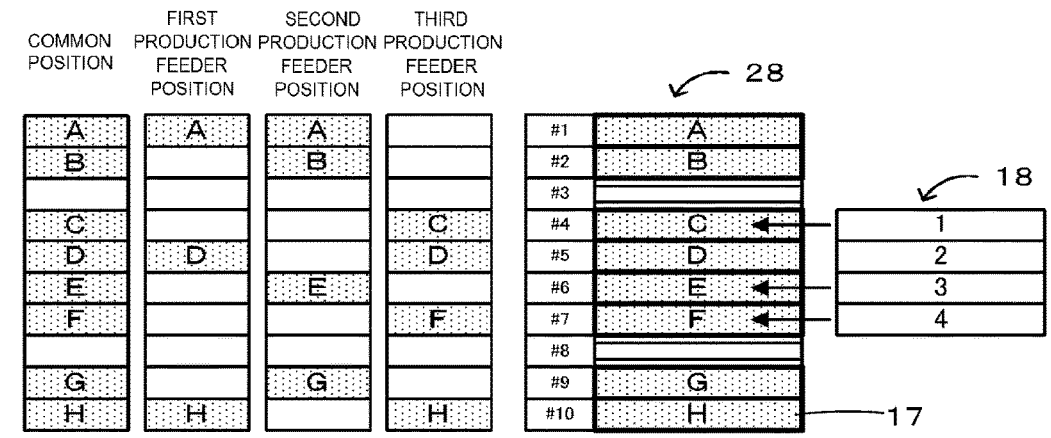

Fig. 6

| OPERATION NUMBER | RECEIVING DESTINATION (COLLECTION) | | LOADING SECTION (LOADING) | | FEEDER ID | HELD COMPONENT NAME | NUMBER OF REMAINING COMPONENTS |
|---|---|---|---|---|---|---|---|
| 1 | STORAGE SECTION | ** | MOUNTING 1 | #1 | A | Part1 | *** |
| 2 | STORAGE SECTION | ** | MOUNTING 1 | #5 | D | Part5 | *** |
| 3 | STORAGE SECTION | ** | MOUNTING 1 | #10 | H | Part8 | *** |
| 4 | STORAGE SECTION | ** | MOUNTING 1 | #2 | B | Part2 | *** |
| 5 | STORAGE SECTION | ** | MOUNTING 1 | #6 | E | Part6 | *** |
| 6 | STORAGE SECTION | ** | MOUNTING 1 | #9 | G | Part7 | *** |
| 7 | STORAGE SECTION | ** | MOUNTING 1 | #4 | C | Part3 | *** |
| 8 | STORAGE SECTION | ** | MOUNTING 1 | #7 | F | Part4 | *** |

Tabs: MOUNTING DEVICE 1 | MOUNTING DEVICE 2 | MOUNTING DEVICE 3 | MOUNTING DEVICE 4 | MOUNTING DEVICE 5

CONFIRM 60, 62, 61, 64

MOVING WORK MANAGEMENT DEVICE, MOVING WORK DEVICE, MOUNTING SYSTEM, AND MANAGEMENT METHOD

TECHNICAL FIELD

The present specification discloses a moving work management device, a moving work device, a mounting system, and a management method.

BACKGROUND ART

Conventionally, a mounting system has been proposed in which a feeder storage is placed in a production line, and an exchange robot (moving work device) is provided which moves between mounting devices and a feeder storage section and exchanges feeders between the mounting devices and the feeder storage section (see Patent Document 1, for example). In this mounting system, a feeder is exchanged by a moving work device at the time of exchanging the feeder.

PATENT LITERATURE

Patent Document 1: International Publication No. 2017/033268

BRIEF SUMMARY

Technical Problem

In a mounting system, for example, in other types of low-volume production, mounting processes may be performed while switching among multiple mounting jobs (mounting condition information). In a mounting system for performing such a production, in order to cut down on the labor of exchanging arrangement positions of feeders holding components for each mounting job, a shared arrangement in which feeders are loaded to positions shared among multiple mounting jobs may be used. However, when a shared arrangement of feeders is used in this mounting system, there is a problem in that it takes time to start the mounting process.

It is a principal object of the present disclosure to provide a moving work management device, a moving work device, a mounting system, and a management method capable of further improving productivity when utilizing a shared arrangement in which the arrangement positions of feeders are shared among multiple types of production.

The present disclosure has taken the following means to achieve the main object described above.

The moving work management device of the present disclosure is a moving work management device used in a mounting system including a mounting device having a mounting section configured to mount components on a mounting target, a supply section configured to load a feeder to one or more loading sections, the feeder having a holding member for holding components, and a mounting control section configured to cause the mounting section to pick up the component from the feeder, wherein the moving work management device comprises a management control section configured to create loading order information including the preferential loading of the feeders to be used in the current production to the loading section over the feeders to be used in the next production onward based on multiple pieces of feeder arrangement information and the order of use of the multiple feeders, the multiple pieces of feeder arrangement information handling each of multiple pieces of mounting condition information for producing multiple types of mounting targets including the arrangement positions of the feeders created corresponding to positions shared among the productions of multiple types of mounting targets.

In this moving work managing device, loading order information including the loading order of the feeders is created based on the feeder arrangement information and the order of use of the feeders, the loading order being a loading order in which the feeders to be used in the current production are preferentially loaded to the loading section over the feeders to be used in the next production or later. The feeder arrangement information handles each of multiple pieces of mounting condition information for producing multiple types of mounting targets, and is created in accordance with a shared arrangement for loading feeders at shared positions in the production of multiple types of mounting targets. In the mounting device, since the feeder can be loaded to the loading section based on the created loading order information and the feeder used in the current production is loaded first to the supply section, the mounting process can be started before feeders used from the next time onward are loaded. In this moving work management device, it is possible to further improve productivity by starting the mounting process earlier. Here, the "mounting target" includes, for example, a board or a substrate having a three-dimensional shape.

BRIEF DESCRIPTION OF DRAWINGS

FIG. 5 is a diagram showing an example of a process for loading feeder 17 with loader 18.

FIG. 6 is a diagram showing an example of loading order display screen 60.

DESCRIPTION OF EMBODIMENTS

The present embodiment will be described below with reference to the drawings.

Figure 1:
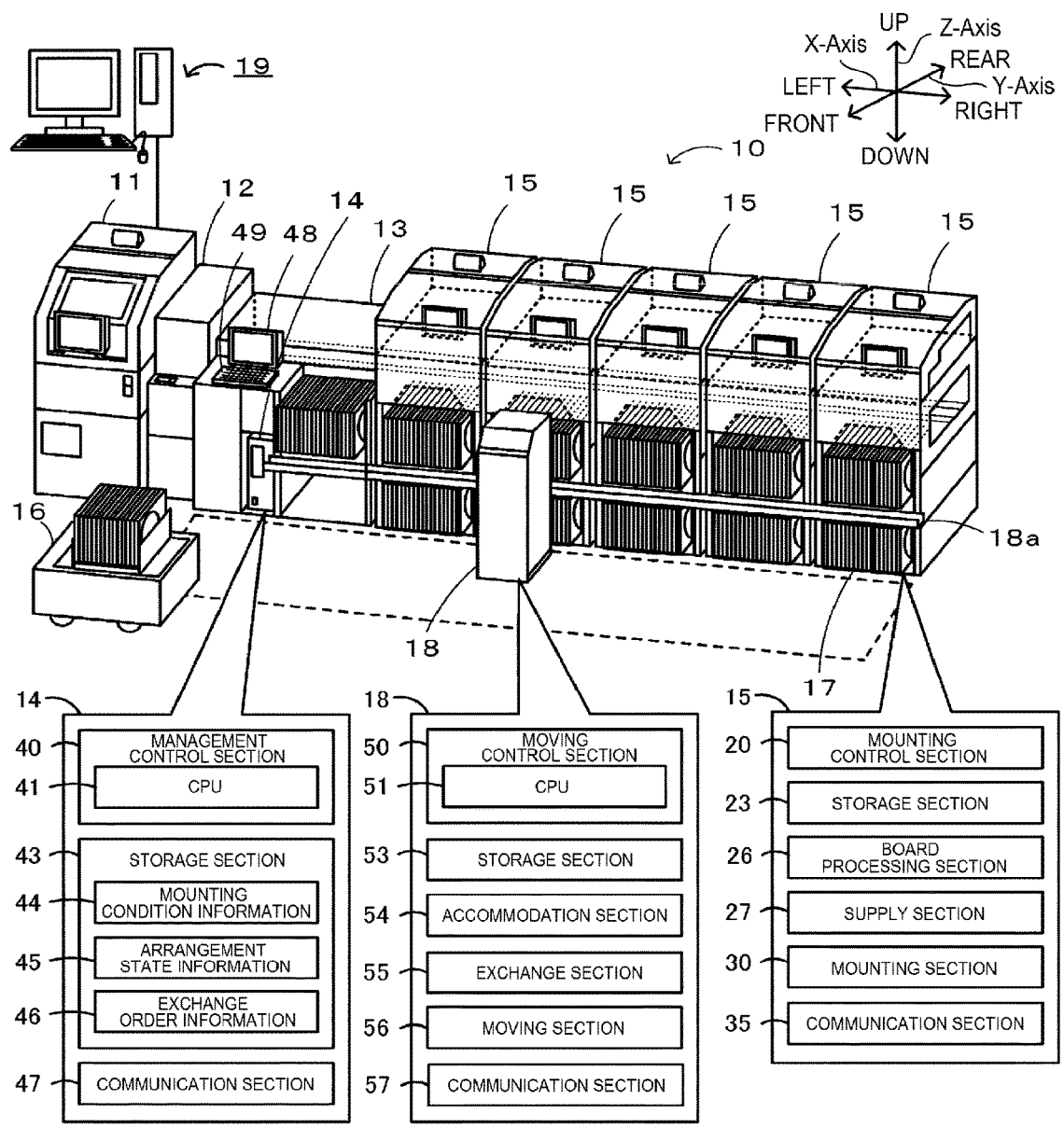
FIG. 1 is a schematic diagram showing an example of mounting system 10.
Figure 2:
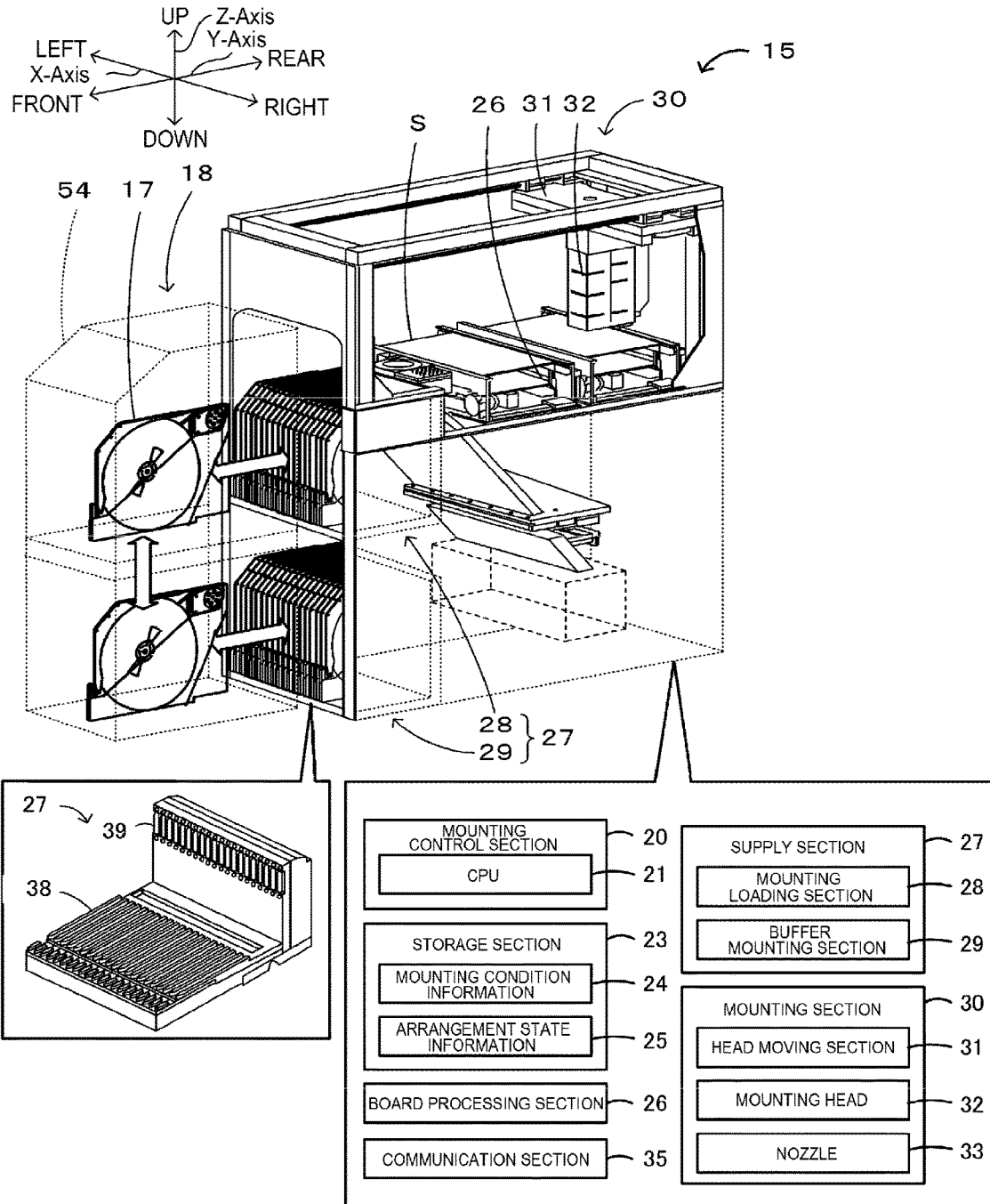
FIG. 2 is a diagram schematically showing a configuration of mounting device 15 and loader 18.
Figure 3:
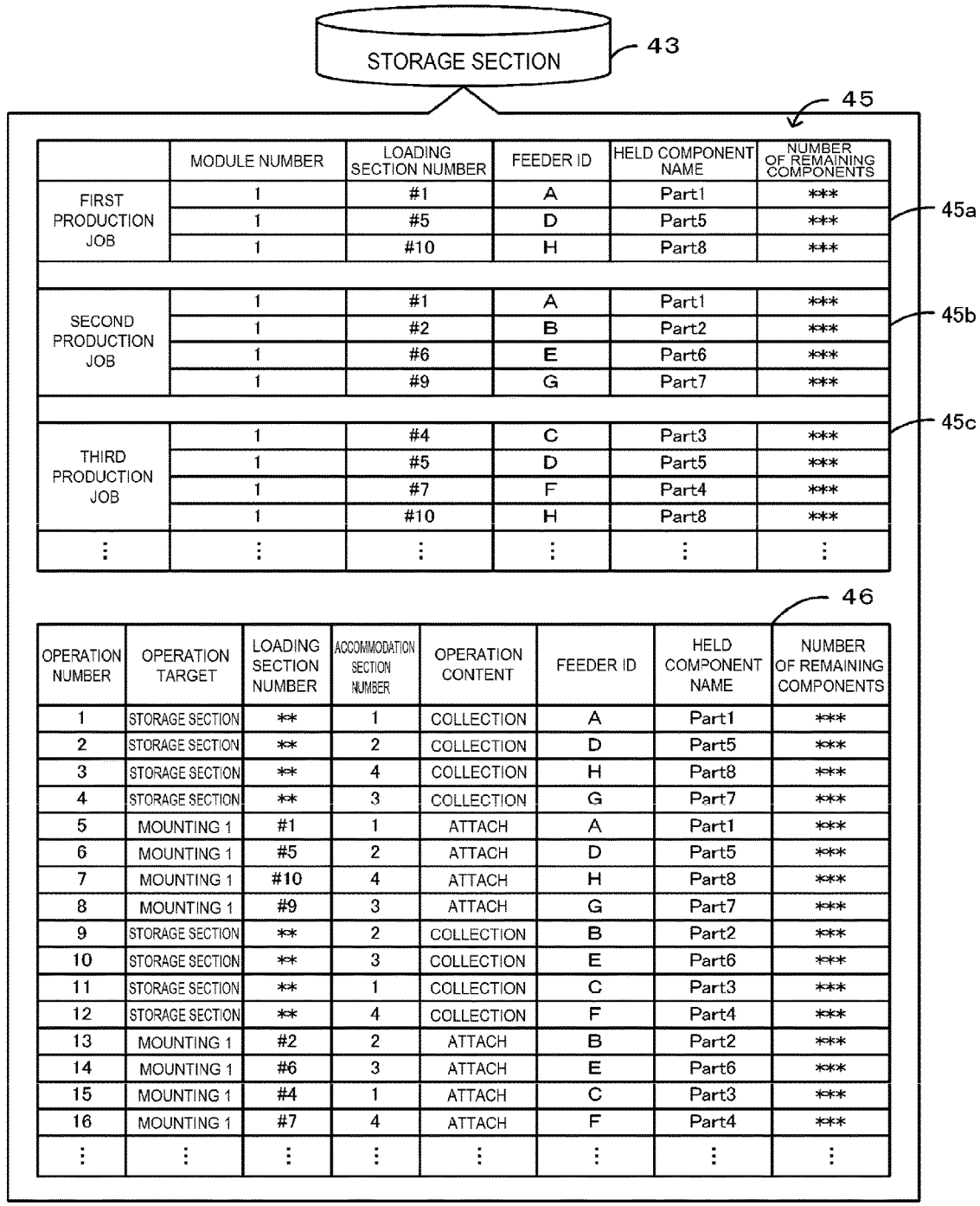
FIG. 3 is a diagram showing an example of information stored in storage section 43.

FIG. 1 is a schematic diagram showing an example of mounting system 10 of the present disclosure. FIG. 2 is a diagram schematically showing a configuration of mounting device 15 and loader 18 which is a moving work device. FIG. 3 is a diagram showing an example of feeder arrangement information 45 and loading order information 46 stored in storage section 43 of management PC 14. In the present embodiment, the left-right direction (X-axis), the front-rear direction (Y-axis), and the up-down direction (Z-axis) are as shown in FIGS. 1 and 2.

Mounting system 10 is configured, for example, as a production line in which devices are arranged in the conveyance direction of board S, the devices being devices for performing processes to mount components on board S which is a mounting target. Here, the mounting target is described as board S, but the present disclosure is not particularly limited to this as long as the object is an object on which components are mounted and may be a substrate having a three-dimensional shape. As shown in FIG. 1, mounting system 10 includes printing device 11, print inspection device 12, feeder storage section 13, management PC 14, mounting device 15, automatic conveyance vehicle 16, loader 18, host PC 19, and the like. Printing device 11 is a device for printing solder paste or the like on board S. Print inspection device 12 is a device for inspecting the state of the printed solder. Feeder storage section 13 is a storage location for storing feeder 17 used in mounting device 15. Feeder storage section 13 is provided below the conveyance device between print inspection device 12 and mounting device 15.

Mounting device 15 is a device for picking up components and mounting components on board S. Mounting device 15 includes mounting control section 20, storage section 23, board processing section 26, supply section 27, mounting section 30, and communication section 35. As shown in FIG. 2, mounting control section 20 is configured as a microprocessor centered on CPU 21 and controls the entire device. Mounting control section 20 outputs control signals to board processing section 26, supply section 27, and mounting section 30, and receives signals from board processing section 26, supply section 27, and mounting section 30. Storage section 33 stores mounting condition information 24, feeder arrangement information 25, and the like. Mounting condition information 24 is a production job and includes information such as information on components, the arrangement order in which components are mounted on board S, arrangement positions, and loading positions from which components are picked up. Mounting condition information 24 is created by host PC 19 with an order and arrangement in which the mounting efficiency is high, transmitted from host PC 19, and stored in storage section 23. Feeder arrangement information 25 is the same information as feeder arrangement information 45 and will be described in detail later. Mounting device 15 acquires mounting condition information 24 and feeder arrangement information 25 from host PC 19. Communication section 35 is an interface for exchanging information with external devices such as management PC 14 and host PC 19.

Board processing device 26 is a unit for conveying in, transporting, securing and unloading board S at a mounting position. Board processing device 26 has a pair of conveyor belts extending in the left-right direction and spaced apart from each other in the front-rear direction in FIG. 1. Board S is conveyed by the conveyor belts.

Supply section 27 is a unit for supplying components to mounting section 30. Supply section 27 loads feeders 17 to one or more loading sections, each feeder 17 having a reel around which a tape serving as a holding member for holding components is wound. As shown in FIG. 2, supply section 27 has two upper and lower loading sections to which feeder 17 can be loaded in the front direction. The upper stage is mounting loading section 28 from which a component can be extracted by mounting section 30, and the lower stage is buffer loading section 29 from which a component cannot be extracted by mounting section 30. Here, mounting loading section 28 and buffer loading section 29 are collectively referred to as the loading section. The loading sections may be managed in module units grouping a predetermined number (e.g., 4 or 12) of feeders 17. Supply section 27 has multiple slots 38, arranged in the X-direction at predetermined intervals so that rail members of feeders 17 are inserted, and connecting portions 39 into which connectors provided at the distal ends of feeders 17 are inserted. Each feeder 17 includes a controller (not shown). The controller stores information such as tape IDs and component types included in feeder 17 and the remaining number of components. When feeder 17 is connected to connecting portion 39, the controller transmits information of feeder 17 to mounting control section 20.

Mounting section 30 is a unit for picking up components from supply section 27 and arranges the components on board S fixed to board processing section 26. Mounting section 30 includes head moving section 31, mounting head 32, and nozzle 33. Head moving section 31 includes a slider guided by guide rails and moved in the XY-direction, and a motor for driving the slider. Mounting head 32 is configured to pick up one or more components and be moved in the XY-direction by head moving section 31. Mounting head 32 is attached to the slider in a detachable manner. One or more nozzles 33 are attached to the lower face of mounting head 32 in a detachable manner. Nozzle 33 is configured to pick up components by use of negative pressure. Aside from nozzle 33, the pickup member for picking up components may be a mechanical chuck or the like that mechanically holds components.

Management PC 14 is a device for managing feeder 17 and is a moving work management device for generating execution data executed by loader 18. Management PC 14 includes management control section 40, storage section 43, communication section 47, display section 48, and input device 49. Management control section 40 is configured as a microprocessor centered on CPU 41 and controls the entire device. Storage section 43 is a device such as an HDD for storing various data such as a processing program. Communication section 47 is an interface for exchanging information with external devices such as mounting device 15 and host PC 19. Display section 48 is a liquid crystal display for displaying various information. Input device 49 includes a keyboard, a mouse, and the like through which an operator inputs various commands.

As shown in FIGS. 1 and 3, storage section 43 stores mounting condition information 44, feeder arrangement information 45, loading order information 46, and the like. Mounting condition information 44 is the same as mounting condition information 24 and is acquired from host PC 19. Feeder arrangement information 45 is information used for the production of board S based on mounting condition information 44, and is information including the arrangement position of feeder 17. Mounting condition information 44 and feeder arrangement information 45 constitute production plan information including a production plan for producing multiple types of boards S. Feeder arrangement information 45 is created in accordance with a shared arrangement in which feeders 17 are loaded at shared positions during the production of multiple types of boards S. In mounting system 10, for example, mounting processes in another type of low-volume production or the like may be performed while switching multiple pieces of mounting condition information 44 (production jobs). In cases where such production is performed, in order to cut down on the labor of exchanging arrangement positions of feeders 17 holding components for each production job, feeders 17 may be loaded to shared positions in multiple production jobs (also referred to as a shared arrangement of feeders 17). Feeder arrangement information 45 is created by host PC 19 so as to provide the most efficient arrangement positions for each feeder 17 based on a shared arrangement method. As shown in FIG. 3, feeder arrangement information 45 includes the module number of supply section 27, the loading section number indicating the position of the loading section, the identification information (ID) of feeder 17 to be loaded to the loading section, the name of the component held by feeder 17, the number of remaining components, and the like. Feeder arrangement information 45a to 45c corresponding to the first to third production jobs is stored in storage section 43, and in each production job, regardless of feeder arrangement information 45, the same type of feeder 17 is set to be loaded to the same loading section, such as loading section #1 for feeder A, loading section #2 for feeder B, and the like. Feeder arrangement information 45 may be managed separately from mounting condition information 44, or may be included in mounting condition information 44. Loading order information 46 is information prepared by management PC 14 so as to include an operation order in which loader 18 loads feeder 17 to supply section 27 before production of board S is started. Loading order information 46 includes information such as the operation number which is the order in which feeders 17 are received or loaded, the operation target with which feeder 17 is exchanged, a loading section number which is the position of the loading section of supply section 27 or feeder storage section 13, the number of accommodation section 54 that accommodates feeder 17, the content of collection or loading work, the ID of feeder 17 that is the operation target, the name of the component held by feeder 17, and the number of remaining components thereof. For example, operation number 1 of loading order information 46 in FIG. 3 defines an operation for collecting (receiving) feeder A loaded to loading section of feeder storage section 13 into the first slot of accommodation section 54. In addition, operation No. 5 defines an operation of loading feeder A accommodated in the first slot of accommodation section 54 to loading section #1 of mounting loading section 28.

Automatic conveyance vehicle 16 is configured to automatically convey feeder 17, a member used in mounting system 10, and the like between a storage chamber (not shown) and feeder storage section 13.

Loader 18 is a moving work device and is a device that moves within a moving area at the front face of mounting system 10 (see dashed lines in FIG. 1) and automatically collects and replenishes feeders 17 of mounting device 15. Loader 18 includes moving control section 50, storage section 53, accommodation section 54, exchange section 55, moving section 56, and communication section 57. Moving control section 50 is configured as a microprocessor centered on CPU 51 and controls the entire device. Storage section 53 is an HDD or the like for storing various data such as processing programs and stores arrangement execution information 45. Accommodation section 54 has an accommodation space for accommodating feeders 17. Accommodation section 54 is configured to accommodate, for example, four feeders 17. Exchange section 55 is a mechanism for moving feeder 17 in and out as well between the upper and lower levels (see FIG. 2). Exchange section 55 has a clamp for clamping feeder 17, a Y-axis slider for moving the clamp in the Y-axis direction (front-rear direction), and a Z-axis slider for moving the clamp in the Z-axis direction (up-down direction). Exchange section 55 loads and unloads feeder 17 at mounting loading section 28 and loads and unloads feeder 17 at buffer loading section 29. Moving section 56 is a mechanism for moving loader 18 in the X-axis direction (the left-right direction) along X-axis rail 18a disposed on the front face of mounting device 15. Communication section 57 is an interface for exchanging information with external devices such as management PC 14 and mounting device 15. Loader 18 outputs the current position and the contents of the executed operation to management PC 14.

Host PC 19 (see FIG. 1) is configured as a server for managing information of each device in mounting system 10. Host PC 19 includes a control section for controlling the entire device, a storage section for storing various information, and a communication section for performing bidirectional communication with external devices such as mounting system 10, automatic conveyance vehicle 16, and loader 18. Host PC 19 acquires and manages information of mounting system 10 in addition to creating and managing condition information and feeder arrangement information used in the mounting of components.

Figure 4:
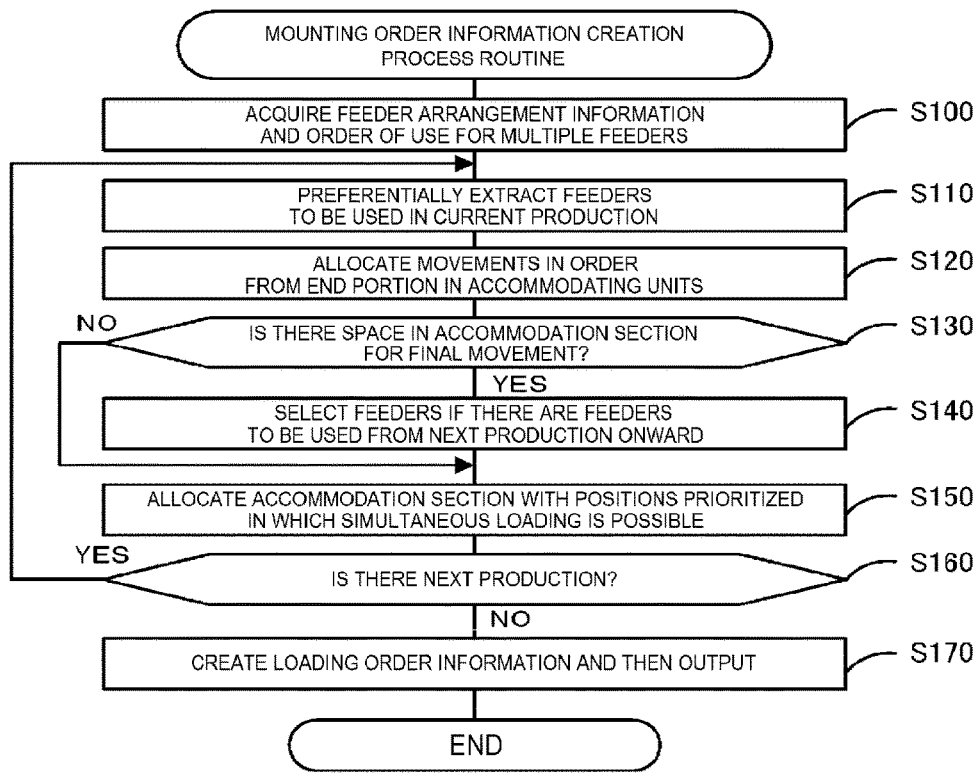
FIG. 4 is a flowchart showing an example of a loading order information creation process routine.

Next, the work of mounting system 10 according to the present embodiment configured as described above, particularly, the process for creating loading order information 46 used when loader 18 loads feeder 17 to mounting device 15 before production of board S is started will be described. FIG. 4 is a flowchart showing an example of a loading order information creation process routine executed by CPU 41 included in management control section 40 of management PC 14. This routine is stored in storage section 43 of management PC 14 and is executed based on input from an operator well before a production plan including the production of multiple boards S. When this routine is started, CPU 41 first reads and acquires feeder arrangement information 45 of multiple feeders and the order of use of feeders 17 included in the production plan (S100) and extracts feeders 17 used in the current production (this time) in priority over feeders 17 used in the next production onward (S110). The order of use of feeders 17 may be included in the information of the production plan. The order of use of feeders 17 may be the order of using feeder arrangement information 45.

Next, CPU 41 performs movement allocation for moving accommodations of accommodation section 54 in accommodating units (four in this case) in order from mounting loading section 28 on the end portion of supply section 27 among the predetermined arrangement positions of the extracted feeders 17 (S120). For example, when feeders 17 stored in feeder storage section 13 are loaded to mounting device 15, CPU 41 performs the process of dividing feeders 17 into units of four in order from feeder 17 to be loaded to mounting loading section 28 closer to feeder storage section 13. It should be noted that the "end portion" may be on the side closer to or farther from feeder storage section 13. Subsequently, CPU 41 determines whether there is space in accommodation section 54 for the final movement (S130). For example, when 11 feeders 17 are used in the current production of board S, the number of feeders 17 in the third final movement is 3, generating a space of one slot in accommodation section 54. If there is available space in accommodation section 54 for the final movement and if there are feeders 17 to be used from the next production onward in addition to feeders 17 to be used in the current production, CPU 41 selects a number of feeders 17 to be used from the next production onward equivalent to the number of slots available (S140). In this selection, CPU 41 preferably prioritizes feeders 17 used in the next production from the next production onward. As a result, CPU 41 can complete the loading of feeders 17 to be used next time more quickly. Further, CPU 41 may preferentially select feeders 17 that can be loaded without moving loader 18, feeders 17 being feeders 17 currently being used and which will be moved in the end, and CPU 41 may preferentially select feeders 17 that can be loaded with a shorter moving distance next. As a result, the moving efficiency of loader 18 is further improved. It should be noted that the selection in S140 is not particularly limited to the above, and CPU 41 may select feeders 17 to be used next time and onward in this order from the end portion of supply section 27.

After S140 or when there are no available slots in accommodation section 54 for the final movement in S130, CPU 41 performs accommodation section allocation for setting which slots in the accommodation section to accommodate feeders 17 for each feeder 17 to which the movement allocation has been performed (S150). In this accommodation section allocation, CPU 41 may prioritize accommodation positions at which loader 18 can be simultaneously load without moving and give the next priority to accommodation positions for which the moving distance of loader 18 is shorter. Specifically, for example, CPU 41 preferentially allocates two feeders 17 which are next to each other in mounting loading section 28 so as to be next to each other in accommodation section 54, and preferentially allocates two feeders 17 which are separated from each other in mounting loading section 28 so as to be accommodated in a separated manner in accommodation section 54. Also in this accommodation allocation, CPU 41 sets loading order in which feeders 17 used in the current production are loaded to mounting loading member 28 in priority over feeders 17 used in the next production or later. As a result, the loading of feeder 17 used in the present production is completed more quickly.

After S150, CPU 41 determines whether there is a next production (S160) and when there is a next production, CPU 41 repeatedly executes the processes of S110 and subsequent steps. That is, feeders 17 are extracted with the next production as the current production and the movement allocation and the accommodation allocation are executed. On the other hand, when there is no next production in S160, loading order information 46 including the set loading order is created (S170), the information is outputted to loader 18 and display section 48 (S180), and the routine is terminated. As shown in FIG. 3, CPU 41 creates loading order information 46 including the operation order, the operation targets, positions of the receiving destination and the loading destination of feeders 17, the accommodation positions of feeders 17, work contents (collection and loading), and information on feeders 17. Loader 18 that has acquired loading order information 46 executes the content of the work specified in loading order information 46. In addition, the work content of loading order information 46 may be displayed on display section 48 as a loading order display screen.

FIG. 5 is a diagram showing an example of a process for loading feeder 17 with loader 18, FIG. 5A is a diagram for moving and loading feeder 17 used in the first production, and FIGS. 5B, 5C are diagrams for moving and loading feeders 17 used in the second and third production, respectively. FIG. 5 shows the content of executing the loading process of loading order information 46 in the arrangement of feeders 17 specified in feeder arrangement information 45 shown in FIG. 3. In FIG. 5, a specific example will be described, for a case of a shared arrangement in which feeders A to H are loaded to #1, 2, 4 to 7, 9, 10 of mounting loading section 28, where feeders A, D, H are used in the first production, feeders A, B, E, G are used in the second production, and feeders C, D, F, H are used in the third production. CPU 51 of loader 18 first executes the operations prescribed by operation numbers 1 to 4 based on the content of loading order information 46. That is, CPU 51 collects feeders 17 stored in feeder storage section 13. At this time, feeders A, D, H are accommodated in accommodation section 54, but since there is an availability of one slot, the feeder to be used next is also accommodated. For the loading to mounting loading section 28, the feeders of the first production are prioritized, and since the last feeder is feeder H, feeder G used in the second production capable of being loaded simultaneously therewith is selected. Feeders H, G are accommodated in adjacent slots so that they can be loaded simultaneously (FIG. 5A). Next, loader 18 executes the operations specified by operation numbers 5 to 8. That is, CPU 51 causes feeders A, D, H, G to be loaded to #1, 2, 4, 3 of mounting loading section 28. When feeders A, D, H are loaded to mounting loading section 28, mounting device 15 can initiate the mounting process of the first production. Subsequently, CPU 51 executes the operations specified by operation Nos. 9 to 12, that is, feeders B, E, C, F are accommodated in slots 2, 3, 1, 4 of accommodation section 54. Then, CPU 51 causes feeders B, E to load to #2, #6 of mounting loading section 28. When feeders B, E are loaded to mounting loading section 28, mounting device 15 can initiate the mounting process of the second production. It should be noted that feeders C, E, F are accommodated in accommodation section 54 of loader 18 so as to be capable of being loaded simultaneously. CPU 51 can load feeders C, F together with the loading of feeder E, making it possible to start the mounting process of the third production at this point in time. Since the moving and loading of feeders 17 takes time, when feeders 17 are sequentially loaded in ascending or descending order of the shared arrangement, the waiting time until the first production is started may increase. In mounting system 10, by giving priority to the loading of feeders 17 of the first production, the mounting process can be started as early as possible.

Here, the correspondence between the constituent elements of the present embodiment and the constituent elements of the present disclosure will be specified. Mounting device 15 of the present embodiment corresponds to a mounting device, management PC 14 corresponds to a moving work management device, and loader 18 corresponds to a moving work device. In addition, supply section 27 corresponds to a supply section, mounting section 28 and buffer mounting section 29 correspond to a mounting section, mounting section 30 corresponds to a mounting section, and mounting control section 20 corresponds to a mounting control section. In addition, accommodation section 54 corresponds to an accommodation section, and moving control section 50 corresponds to a moving control section. In addition, mounting condition information 44 corresponds to mounting condition information, feeder 17 corresponds to a feeder, loading information 46 corresponds to loading order information, and management control section 40 corresponds to a management control section. In addition, the tape corresponds to a holding member, and board S corresponds to a mounting target.

In mounting system 10 described above, loading order information 46 including the loading order of feeders 17 is created based on feeder arrangement information 45 and the order of use of feeders 17, the loading order being a loading order in which feeders 17 to be used in the current production are preferentially loaded to the loading section over feeders 17 to be used in the next production or later. Feeder arrangement information 45 handles each of multiple pieces of mounting condition information 44 for producing multiple types of boards S and is created in accordance with a shared arrangement for loading feeders at shared positions in the production of multiple types of boards S. In mounting device 15, since feeders 17 can be loaded to the loading section based on the created loading order information 46, and feeders 17 used in the current production are loaded to supply section 27 first, the mounting process can be started before feeders 17 used from the next time onward are loaded. In management PC 14, it is possible to further improve productivity by starting the mounting process earlier. In addition, mounting system 10 includes loader 18 having accommodation section 54 for accommodating feeders 17 and moving control section 50 for moving feeders 17 to collect feeders 17 from supply section 27 or load feeders 17 to supply section 27, and management control section 40 outputs the created loading order information 46 to loader 18. In management PC 14, productivity can be further improved as a result of loader 18 using loading order information 46. In addition, mounting system 10 includes loader 18, and management control section 40 creates loading order information 46 for accommodating and moving feeders 17 used in the next production in an available accommodation section 54 in addition to feeders 17 used in the current production when space is generated in accommodation section 54. In management PC 14, it is possible to further improve the moving efficiency of loader 18. Furthermore, management control section 40 creates loading order information 46 for loading feeders 17 used in the current production from mounting loading section 28 on the end portion of supply section 27 among the predetermined arrangement positions. In management PC 14, by loading feeders 17 to mounting loading section 28 in this order from the end portion, the moving efficiency of loader 18 is enhanced, making it possible to start the mounting process earlier.

It is obvious that the present disclosure is not limited to the above-described embodiments and can be implemented in various modes as long as the modes belong to the technical scope of the present disclosure.

For example, in the above embodiment, mounting system 10 includes loader 18, and loader 18 moves and loads feeders 17. However, the present disclosure is not particularly limited to this, and automatic conveyance vehicle 16 may move and load feeders 17. Alternatively, without having loader 18, mounting system 10 may be a system in which an operator checks the loading order display screen displayed on display section 48 and cause feeders 17 to be sequentially loaded to mounting loading section 28. FIG. 6 is a diagram showing an example of loading order display screen 60. Loading order display screen 60 includes cursor 61, loading order display section 62, and confirmation key 64. The loading order display section includes the operation number, the device name, the position of the loading destination, the loading section of the loading destination, information of feeder 17, and the like. The operator checks loading order display screen 60 and causes feeders 17 to load to mounting loading section 28 in the displayed operation order. When all feeders 17 used in the current mounting condition information 44 and feeder arrangement information 45 are loaded, mounting device 15 starts the mounting process. Also in this mounting system 10, since feeders 17 used in the current production are loaded to supply section 27 first, the mounting process can be started before feeders 17 used in the next production onward are loaded.

In the above embodiment, feeder arrangement information 45 is created by a shared arrangement method, and mounting device 15 is described as having only feeders 17 of a shared arrangement, but the present disclosure is not particularly limited thereto, and feeders 17 other than those of a shared arrangement may also be used. That is, mounting device 15 may execute the mounting process also using individual feeder 17 corresponding to mounting condition information 44. For example, management control section 40 further acquires individual arrangement information including the arrangement position at which the feeder is individually loaded to mounting loading section 28 in addition to feeder arrangement information 45 created from the shared arrangement information, and the management control section creates, even for feeders 17 included in individual arrangement information, loading order information 46 that prioritizes feeders 17 used in the current production over feeders used in the next production onward. In this moving work management device, it is possible to further improve productivity even in a case where an individual arrangement is included in addition to the shared arrangement.

In the above embodiment, in a case in which space is generated in accommodation section 54, loading order information 46 is created in which loading order information 46 causes feeders 17 to be used in the next production onward, in addition to feeders 17 used in the current production, to be accommodated in the available accommodation section 54, but the present disclosure is not particularly limited thereto, and feeders 17 of the next production onward need not be accommodated in accommodation section 54. When feeders 17 to be used currently are loaded to mounting loading section 28, the mounting process can be started.

In the above embodiment, loading order information 46 for loading feeders 17 from mounting loading section 28 at the end portion is created, but the present disclosure is not particularly limited thereto, and feeders 17 may be loaded from any position as long as feeders 17 used in the current production are preferentially loaded. In the above embodiment, feeders 17 that can be loaded without moving loader 18 are prioritized in S140 and S150 and feeders 17 that can be loaded with a shorter moving distance are prioritized next, but the present disclosure is not particularly limited thereto, and other priorities may be employed.

In the above embodiment, the order of loading of feeders 17 is set by acquiring feeder arrangement information 45 and the order of use of feeders 17, but the present disclosure is not particularly limited to this, and, for example, mounting condition information 44, feeder arrangement information 45, the production plan including the order of execution thereof, or the like may be acquired, or mounting condition information 44 including feeder arrangement information 45 and the order of execution of mounting condition information 44 may be acquired.

In the above embodiment, mounting system 10 includes printing device 11, print inspection device 12, feeder storage 13, management PC 14, and mounting device 15, but the present disclosure is not particularly limited thereto, and one or more of the above devices may be omitted or other devices may be added.

In the above embodiment, management PC 14 installed in feeder storage section 13 has been described as managing loader 18, but the present disclosure is not particularly limited to this and may be provided with this function in other devices such as host PC 19, mounting device 15, and loader 18, for example.

In the above embodiment, the present disclosure is applied to a mode of mounting system 10, but the present disclosure may be applied to management PC 14 (moving work management device) or loader 18 (moving work device), or may be applied to the management method of moving work.

Here, the moving work management device, the moving work device, the mounting system, and the management method according to the present disclosure may be configured as follows. For example, in the moving work management device of the present disclosure, the mounting system may include a moving work device may include an accommodation section configured to accommodate the feeder, and a moving work device having a moving control section configured to move the feeder so as to collect the feeder from the supply section or load the feeder to the supply section; and the management control section may output the created loading order information to the moving work device. In this moving work management device, productivity can be further improved as a result of the moving work device using the loading order information.

In the moving work management device of the present disclosure, the mounting system may include an accommodation section configured to accommodate multiple feeders, and a moving work device having a moving control section configured to collect the feeder from the supply section or load the feeder to the supply section and cause the feeder to move; and the management control section may create, when space is generated in the accommodation section, the loading order information for accommodating and moving the feeder to be used in the next production or later in the available accommodation section in addition to the feeder to be used in the current production. In this moving work management device, it is possible to further reduce the moving distance of the feeder of the moving work device.

In the moving work management device of the present disclosure, the management control section may further acquire individual arrangement information including the arrangement position at which the feeder is individually loaded in addition to the feeder arrangement information created from the shared arrangement information, and the management control section may create, even for feeders included in individual arrangement information, the loading order information that prioritizes the feeder used in the current production over the feeders used in the next production onward. In this moving work management device, it is possible to further improve productivity even in a case where an individual arrangement is included in addition to the shared arrangement.

In the moving work management device of the present disclosure, the management control section may create the loading order information for loading the feeder used in the current production in order from the loading section on the end portion of the supply section among the predetermined arrangement positions. In this moving work management device, by loading the feeders in order from the end side, it is possible to further suppress the movement of the moving work device and causing the mounting process to start even earlier.

A moving work device used in a mounting system comprising a mounting device provided with a mounting section configured to mount a component on a mounting target, a supply section configured to load a feeder, including a holder for holding components, to one or more loading sections, and a mounting control section configured to cause the mounting section to pick up the component from the feeder; wherein the moving work device comprises an accommodation section configured to accommodate the feeder; a moving control section configured to move the feeder to the accommodation section and load the feeder to the loading section based on loading order information including the preferential loading of the feeders to be used in the current production to the loading section over the feeders to be used in the next production onward based on multiple pieces of feeder arrangement information and the order of use of the multiple feeders, the multiple pieces of feeder arrangement information handling each of multiple pieces of mounting condition information for producing multiple types of mounting targets including the arrangement positions of the feeders created corresponding to positions shared among the productions of multiple types of mounting targets.

Similar to the moving work management device described above, the moving work device can load the feeder to the loading section using the loading order information that causes the feeder used in the current production to be preferentially loaded to the loading section over the feeder used in the next production or later. In the mounting device, since the feeder used in the current production is loaded first to the supply section, the mounting process can be started before feeders used from the next time onward are loaded. In this moving work device, it is possible to further improve productivity by causing the mounting process to start earlier.

The mounting system of the present disclosure includes a mounting section configured to mount a component on a mounting target; a supply section configured to load a feeder including a holding member for holding the component on one or more mounters; a mounting device having a mounting control section configured to cause the mounting section to pick up the component from the feeder; the moving work management device described in any of the above; and the moving work device described in any of the above.

Similar to the moving work management device described above, the mounting system can load the feeder to the loading section using the loading order information that causes the feeder used in the current production to be preferentially loaded to the loading section over the feeder used in the next production or later. In the mounting device, since the feeder used in the current production is loaded first to the supply section, the mounting process can be started before feeders used from the next time onward are loaded. In this mounting system, it is possible to further improve productivity by causing the mounting process to start earlier.

The management method of the present disclosure is a management method used in a mounting system including a mounting device having a mounting section configured to mount components on a mounting target, a supply section configured to load a feeder to one or more loading sections, the feeder having a holding member for holding components, and a mounting control section configured to cause the mounting section to pick up the component from the feeder, wherein the management method comprises a step for creating loading order information including the loading order of the feeders to be loaded to the loading section with preference given to the feeders to be used in the current production over the feeders to be used in the next production onward based on multiple pieces of feeder arrangement information and the order of use of the multiple feeders, the multiple pieces of feeder arrangement information handling each of multiple pieces of mounting condition information for producing multiple types of mounting targets including the arrangement positions of the feeders created corresponding to positions shared among the productions of multiple types of mounting targets.

Similar to the moving work management device described above, the management method can load the feeder to the loading section using the loading order information that causes the feeder used in the current production to be preferentially loaded to the loading section over the feeder used in the next production or later. In the mounting device, since the feeder used in the current production is loaded first to the supply section, the mounting process can be started before feeders used from the next time onward are loaded. In this moving work device, it is possible to further improve productivity by causing the mounting process to start earlier. In this management method, various modes of the above-described moving work management device may be employed or steps for achieving each function of the above-described moving work management device may be added.

INDUSTRIAL APPLICABILITY

The present disclosure is applicable to the technological field of devices for picking up and mounting components.

REFERENCE SIGNS LIST

10 Mounting system, 11 Printing device, 12 Print inspection device, 13 Feeder storage section, 14 Management PC, 15 Mounting device, 16 Automatic conveyance vehicle, 17 Feeder, 18 Loader, 18a X-axis rail, 19 Host PC, 20 Mounting control section, 21 CPU, 23 Storage section, 24 Mounting condition information, 25 Feeder arrangement information, 26 Board processing section, 27 Supply section, 28 Mounting loading section, 29 Buffer loading section, 30 Mounting section, 31 Head moving unit, 32 Mounting head, 33 Nozzle, 35 Communication section, 38 Slot, 39 Connecting portion, 40 Management control section, 41 CPU, 43 Storage section, 44 Mounting condition information, 45, 45a to 45c Feeder arrangement information, 46 Loading order information, 47 Communication section, 48 Display section, 49 Input device, 50 Moving control section, 51 CPU, 53 Storage section, 54 Accommodation section, 55 Exchange section, 56 Moving section, 57 Communication section, 60 Loading order display screen, 61 Cursor, 62 Loading order display, 64 Confirmation key, and S board

The invention claimed is:

1. A moving work management device used in a mounting system comprising a mounting device provided with a mounting section configured to mount a component on a mounting target, a supply section configured to load feeders, including a holder for holding components, to a loading section, and a mounting control section configured to cause the mounting section to pick up the component from the feeders;
wherein the moving work management device comprises a management control section configured to create loading order information including preferential loading order of the feeders to be used in a current production to the loading section over next feeders to be used in a next production onward based on multiple pieces of feeder arrangement information and an order of use of the feeders, the multiple pieces of feeder arrangement information handling each of multiple pieces of mounting condition information for producing multiple types of mounting targets including arrangement positions of the feeders created corresponding to positions shared among productions of the multiple types of mounting targets.

2. The moving work management device of claim 1, wherein the mounting system comprises: an accommodation section configured to accommodate the feeders, and a loader including a moving control section configured to move a feeder to be collected from the supply section or be loaded to the supply section; and
the management control section outputs the created loading order information to the loader.

3. The moving work management device of claim 1, wherein the mounting system comprises: an accommodation section configured to accommodate multiple feeders, and a loader including a moving control section configured to move the feeder to be collected from the supply section or be loaded to the supply section; and
the management control section creates, when space is generated in the accommodation section, the loading order information for accommodating and moving the feeder to be used in the next production onward in an available accommodation section in addition to the feeder to be used in the current production.

4. The moving work management device of claim 1, wherein the management control section further acquires individual arrangement information including the arrangement positions at which the feeders are individually loaded in addition to the feeder arrangement information created from the shared arrangement information, and the management control section creates, even for feeders included in the individual arrangement information, the loading order information that prioritizes the feeders used in the current production over the feeders used in the next production onward.

5. A moving work device used in a mounting system comprising a mounting device provided with a mounting section configured to mount a component on a mounting target, a supply section configured to load feeders, including a holder for holding components, to a loading section, and a mounting control section configured to cause the mounting section to pick up the component from the feeders;
wherein the moving work device comprises an accommodation section configured to accommodate the feeders; a moving control section configured to move the feeders to the accommodation section and load the feeders to the loading section based on loading order information including a preferential loading order of the feeders to be used in a current production to the loading section over next feeders to be used in a next production onward based on multiple pieces of feeder arrangement information and a order of use of multiple feeders, the multiple pieces of feeder arrangement information handling each of multiple pieces of mounting condition information for producing multiple types of mounting targets including the arrangement positions of the feeders created corresponding to positions shared among productions of multiple types of mounting targets.

6. A mounting system comprising:
a mounting section configured to mount a component on a mounting target; a supply section configured to load feeders, including a holding member for holding components, a loading section; a mounting device having a mounting control section configured to cause the mounting section to pick up the components from the feeders;
a moving work management device including a management control section configured to create loading order information including preferential loading order of the feeders to be used in a current production to the loading section over next feeders to be used in a next production onward based on multiple pieces of feeder arrangement information and an order of use of the feeders, the multiple pieces of feeder arrangement information handling each of multiple pieces of mounting condition information for producing multiple types of mounting targets including arrangement positions of the feeders created corresponding to positions shared among productions of the multiple types of mounting targets; and
the moving work device of claim 5.

7. A management method used in a mounting system comprising a mounting device provided with a mounting section configured to mount a component on a mounting target, a supply section configured to load feeders, including a holder for holding components, to a loading section, and a mounting control section configured to cause the mounting section to pick up the component from the feeders;

wherein the management method comprises a step for creating loading order information including a loading order of the feeders to be loaded to the loading section with preference given to the feeders to be used in a current production over next feeders to be used in a next production onward based on multiple pieces of feeder arrangement information and a order of use of the feeders, the multiple pieces of feeder arrangement information handling each of multiple pieces of mounting condition information for producing multiple types of mounting targets including the arrangement positions of the feeders created corresponding to positions shared among productions of multiple types of mounting targets.

* * * * *